(12) United States Patent
Wang et al.

(10) Patent No.: US 10,573,850 B2
(45) Date of Patent: Feb. 25, 2020

(54) MANUFACTURING OLED PANEL BY UTILIZING MORPHOLOGICAL TRANSFORMATION LAYER

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Xinxin Wang, Beijing (CN); Wenbin Jia, Beijing (CN); Yue Hu, Beijing (CN); Lifang Song, Beijing (CN); Zhijie Ye, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/983,439

(22) Filed: May 18, 2018

(65) Prior Publication Data
US 2019/0181386 A1 Jun. 13, 2019

(30) Foreign Application Priority Data
Dec. 12, 2017 (CN) .......................... 2017 1 1319456

(51) Int. Cl.
*H01L 51/56* (2006.01)
*H01L 51/52* (2006.01)
(Continued)

(52) U.S. Cl.
CPC .......... *H01L 51/56* (2013.01); *H01L 27/3246* (2013.01); *H01L 27/3276* (2013.01);
(Continued)

(58) Field of Classification Search
CPC . H01L 51/56; H01L 51/0012; H01L 51/5228; H01L 51/5012
See application file for complete search history.

(56) References Cited

U.S. PATENT DOCUMENTS

| 2006/0066006 A1* | 3/2006 | Haraldsson | ............ B82Y 10/00 264/255 |
| 2011/0109012 A1* | 5/2011 | Furutono | ............... B82Y 10/00 264/293 |

(Continued)

FOREIGN PATENT DOCUMENTS

| CN | 104269494 | 1/2015 |
| CN | 105742332 | 7/2016 |
| CN | 106887407 | 6/2017 |

OTHER PUBLICATIONS

First Office Action for CN Appl. No. 201711319456.4, dated Mar. 6, 2019.

*Primary Examiner* — Stephen M Bradley
(74) *Attorney, Agent, or Firm* — Foley & Lardner LLP; James F. Ewing; Paul M. H. Pua

(57) ABSTRACT

The present disclosure relates to an OLED panel, manufacturing method thereof, and a display device. The method for manufacturing an OLED panel comprises: forming an auxiliary electrode layer on a substrate, and forming a morphological transformation layer on the auxiliary electrode layer; forming an organic functional layer, wherein the organic functional layer covers the morphological transformation layer; removing the morphological transformation layer and a part of the organic functional layer corresponding to the morphological transformation layer from the auxiliary electrode layer; and forming a cathode layer on the organic functional layer and the auxiliary electrode layer.

20 Claims, 2 Drawing Sheets

(51) Int. Cl.
*H01L 51/00* (2006.01)
*H01L 27/32* (2006.01)
*H01L 51/50* (2006.01)

(52) U.S. Cl.
CPC ...... *H01L 51/0012* (2013.01); *H01L 51/0016* (2013.01); *H01L 51/5218* (2013.01); *H01L 51/5228* (2013.01); *H01L 51/5012* (2013.01)

(56) References Cited

U.S. PATENT DOCUMENTS

| | | |
|---|---|---|
| 2012/0252303 A1 | 10/2012 | Otsuka et al. |
| 2014/0099738 A1 | 4/2014 | Lee et al. |
| 2014/0203247 A1* | 7/2014 | Kim ................ H01L 24/11 |
| | | 257/40 |
| 2016/0254455 A1* | 9/2016 | Wang ............... H01L 51/5234 |
| | | 438/23 |

* cited by examiner

MANUFACTURING OLED PANEL BY UTILIZING MORPHOLOGICAL TRANSFORMATION LAYER

CROSS-REFERENCE TO RELATED APPLICATIONS

The present application claims priority to Chinese Patent Application No. 201711319456.4 filed on Dec. 12, 2017, which is hereby incorporated by reference in its entirety into the present application for all purposes.

TECHNICAL FIELD

The present disclosure relates to an OLED panel, manufacturing method thereof, and a display device.

BACKGROUND

In recent years, Organic Light-Emitting Diode (OLED) becomes the most promising novel display device in recent years for its self-luminous, full solid state and high contrast. A pixel structure comprises an array substrate and a color film substrate. The array substrate comprises a thin film transistor device layer, an anode layer, a light-emitting layer and a cathode layer formed on a first substrate. When the display panel is working, a voltage is applied between the anode and the cathode, so that the light-emitting layer is excited to emit light, and the light travels through the transparent cathode and the color film substrate on top to achieve top emission.

SUMMARY

The present disclosure provides an OLED panel, manufacturing method thereof, and a display device.

In an embodiment of this disclosure, a method for manufacturing an OLED panel is provided, the method comprising: forming an auxiliary electrode layer on a substrate, and forming a morphological transformation layer on the auxiliary electrode layer; forming an organic functional layer, wherein the organic functional layer covers the morphological transformation layer; removing the morphological transformation layer and a part of the organic functional layer corresponding to the morphological transformation layer from the auxiliary electrode layer; and forming a cathode layer on the organic functional layer and the auxiliary electrode layer.

In an example, wherein a material for manufacturing the morphological transformation layer comprises a material having an azobenzene group, and removing the morphological transformation layer and a part of the organic functional layer corresponding to the morphological transformation layer from the auxiliary electrode layer comprises: making a side of the substrate on which the organic functional layer is formed face down, and irradiating the organic functional layer with ultraviolet light.

In an example, wherein the material for manufacturing the morphological transformation layer further comprises ferromagnetic particles, and removing the morphological transformation layer and a part of the organic functional layer corresponding to the morphological transformation layer from the auxiliary electrode layer further comprises: attracting the ferromagnetic particles in the morphological transformation layer with a magnetic attraction force.

In an example, wherein irradiating the organic functional layer with ultraviolet light comprises: irradiating the part of the organic functional layer corresponding to the morphological transformation layer with ultraviolet light.

In an example, wherein a material for manufacturing the morphological transformation layer comprises a material having an azobenzene group, and removing the morphological transformation layer and a part of the organic functional layer corresponding to the morphological transformation layer from the auxiliary electrode layer comprises: irradiating the organic functional layer with ultraviolet light and making a side of the substrate on which the organic functional layer is formed face down.

In an example, wherein the material for manufacturing the morphological transformation layer further comprises ferromagnetic particles, and removing the morphological transformation layer and a part of the organic functional layer corresponding to the morphological transformation layer from the auxiliary electrode layer further comprises: attracting the ferromagnetic particles in the morphological transformation layer with a magnetic attraction force.

In an example, wherein irradiating the organic functional layer with ultraviolet light comprises: irradiating the part of the organic functional layer corresponding to the morphological transformation layer with ultraviolet light.

In an example, wherein a material for manufacturing the morphological transformation layer comprises ferromagnetic particles, and removing the morphological transformation layer and a part of the organic functional layer corresponding to the morphological transformation layer from the auxiliary electrode layer comprises: irradiating the organic functional layer with ultraviolet light and attracting the ferromagnetic particles in the morphological transformation layer with a magnetic attraction force.

In an example, wherein irradiating the organic functional layer with ultraviolet light comprises: irradiating the part of the organic functional layer corresponding to the morphological transformation layer with ultraviolet light.

In an example, wherein the auxiliary electrode layer is located in a non-pixel light-emitting region of the cathode layer.

In an example, wherein a material for manufacturing the auxiliary electrode layer comprises: silver, magnesium, aluminum or alloy metal.

In an example, wherein the auxiliary electrode layer has a thickness in a range of about 200 nm-2000 nm.

In an example, wherein the auxiliary electrode layer has a resistivity less than $5*10^{-8}$ $\Omega \cdot m$.

In an example, the method further comprises: forming an anode layer on the substrate before forming the morphological transformation layer on the auxiliary electrode layer.

In an example, wherein the anode layer is reflective.

In another embodiment of this disclosure, an OLED panel manufactured by the manufacturing method of the OLED panel according to any of the above technical solutions is provided.

In an example, the OLED panel further comprises: a pixel-defining layer for separating the auxiliary electrode layer from the anode layer.

In an example, wherein a thickness of the auxiliary electrode layer is less than a thickness of the pixel-defining layer.

In an example, wherein an auxiliary electrode is provided for each pixel-defining layer, or an auxiliary electrode is provided for a plurality of pixel-defining layers.

In still another embodiment of this disclosure, a display device comprising the OLED panel as stated above is provided.

These or other aspects of the present disclosure will be more simple and easily understood in the description of the following embodiments.

DETAILED DESCRIPTION

The present disclosure will be further described below in combination with the accompanying drawings and the illustrative embodiments, wherein the same reference signs in the accompanying drawings all refer to the same composite parts. In addition, if detailed descriptions of the technologies are not pertinent to the illustration of the features of the present disclosure, they are omitted here.

In order to increase the transmittance of light in a top-emitting OLED device, it is required that the cathode adopts a thinner transparent conductive material. However, the thinner transparent cathode has a very large resistance, and a larger voltage drop will occur when the current flows through the cathode. Therefore, the farther a pixel from the power supply point, a lower cathode voltage obtained. As a result, the pixel has a lower display brightness than that of the pixel nearer the power supply point, such that the brightness uniformity of the OLED display device becomes worse.

In order to solve this problem, it is proposed in the related technologies that an auxiliary electrode with a smaller resistance is arranged on the color film substrate so as to reduce the resistance of the cathode. However, such a process is complex, tends to result in an open circuit between the cathode and the auxiliary electrode.

The present disclosure proposes irradiating a morphological transformation layer with ultraviolet light, so that the morphological transformation layer and a part of the organic functional layer corresponding to the morphological transformation layer are removed from the auxiliary electrode layer, thereby exposing the auxiliary electrode. Then a cathode layer is formed to realize an effective contact between the auxiliary electrode layer and the cathode layer, thereby reducing the voltage drop of the cathode layer, and increasing the uniformity of display brightness of the display device. The present discloses utilizes the characteristic that the morphological transformation layer can be transformed from a solid state to a liquid state under the irradiation with a ultraviolet lamp, without the need of manufacturing the organic functional layer in a segmental manner, which simplifies the manufacturing process.

The present disclosure utilizes the gravity to enable the liquid morphological transformation layer and the corresponding part of the organic functional layer to be actively removed from the auxiliary electrode layer, without the need of adding an external assistance, which simplifies process conditions of the OLED panel, and reduces manufacturing costs.

The present disclosure further provides a morphological transformation layer doped with ferromagnetic particles, which utilizes the magnetic attraction received by ferromagnetic particles solely or in combination with the gravity, so that the morphological transformation layer can be more completely removed from the auxiliary electrode layer, e.g., transferred to a receptor substrate.

Figure 1:
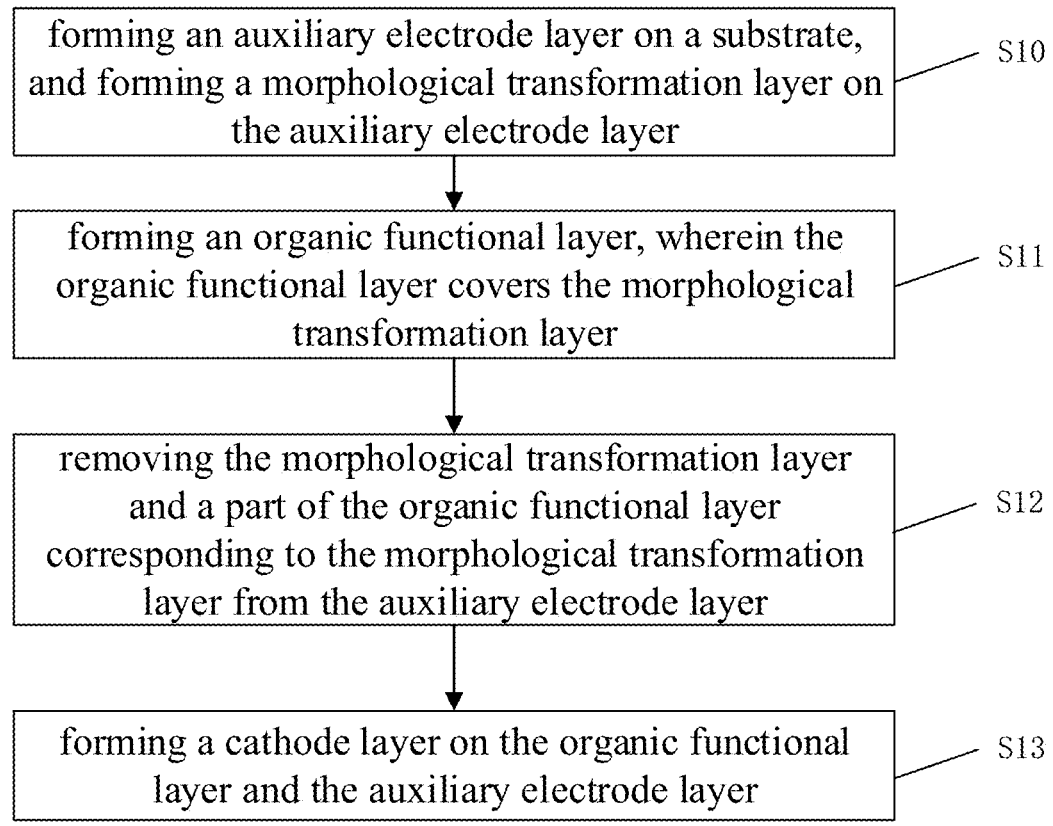
FIG. 1 is a schematic diagram showing a flowchart of a method of manufacturing an OLED panel provided by an embodiment of the present disclosure.

The present disclosure provides a method of manufacturing an OLED panel, a schematic diagram of the flowchart of which is shown in FIG. 1. The method comprises the following steps.

In step S10, an auxiliary electrode layer is formed on a substrate, and a morphological transformation layer is formed on the auxiliary electrode layer;

In an example, the auxiliary electrode layer can be deposited by evaporation, sputtering or inkjet printing and etc. The morphological transformation layer can be secured onto the auxiliary electrode layer by inkjet printing, evaporation and etc., so that the morphological transformation layer covers the auxiliary electrode layer.

The auxiliary electrode layer is arranged in a non-pixel light-emitting region of the cathode layer. The material of the auxiliary electrode layer is electrically conductive. The auxiliary electrode layer, by electrically connecting with the cathode layer, can increase an equivalent thickness of the cathode layer, thereby reducing the resistance of the cathode layer and avoiding the issue of a higher voltage drop caused by the use of a thinner metal material by the cathode.

Light is incident from the organic functional layer to the cathode layer, and is emitted out of the light-emitting region of the cathode layer. Through the high electrical conductivity of the auxiliary electrode layer, the resistance of the whole cathode layer is reduced, such that a voltage difference between the center and edges of the screen becomes smaller, the brightness difference of the light at the positions corresponding to the center and the edges of the screen in the organic functional layer becomes smaller, and that the display brightness of the whole screen is more uniform. Moreover, as the auxiliary electrode layer lies in the non-light-emitting region of the cathode layer, it will not block the light passing through the light-emitting region of the cathode layer, will not affect the display brightness of the screen either, and at the same time can improve the aperture rate of an OLED panel.

An embodiment may design the distribution of the auxiliary electrodes according to a magnitude of the surface resistance of the cathode layer. For example, when the surface resistance is larger, one auxiliary electrode is provided for each pixel-defining layer, and when the surface resistance is smaller, one auxiliary electrode is provided for a plurality of pixel-defining layers (e.g., for every 2 or 3 pixel-defining layers).

A material for manufacturing the auxiliary electrode layer comprises a material with high conductivity, such as silver, magnesium, aluminum and alloy metal, which can increase the conductivity of the cathode layer and reduce a voltage difference from the center to the edges of the screen, when the auxiliary electrode layer is in effective contact with the cathode layer.

A thickness of the auxiliary electrode layer is in a range of about 200 nm-2000 nm. For example, the thickness of the auxiliary electrode layer can be 500 nm, 1000 nm and other values. Those skilled in the art would appreciate that a suitable thickness can be selected within the thickness range as needed.

The resistivity of the auxiliary electrode layer is less than $5*10^{-8}$ Ω·m. Low resistivity enables the auxiliary electrode layer to be conductive, so as to increase the conductivity of the cathode layer and reduce a voltage difference from the center to the edges of the screen when the auxiliary electrode layer is in effective contact with the cathode layer.

In an example, a material for manufacturing the morphological transformation layer comprises a material having an azobenzene group. Such a material has the following two structures: a thermodynamically stable cis-structure and a metastable trans-structure. Under the irradiation with ultraviolet light, the stable cis solid morphology is transformed into a metastable trans liquid morphology. The morphological transformation layer as transformed is removed from the auxiliary electrode layer under the irradiation with ultraviolet light, thereby exposing the exposed auxiliary electrode layer, and preparing for the effective contact between the auxiliary electrode layer and the cathode layer in subsequent steps.

In order that, the morphological transformation layer, after being transformed into the liquid state, takes away the organic functional layer, in some embodiments of this disclosure, a thickness range of the morphological transformation layer is 100 nm-800 nm. For example, the thickness of the morphological transformation layer can be 100 nm, 200 nm, 500 nm, 800 nm and so on. In an example, the thickness of the morphological transformation layer can be determined from the thickness of the auxiliary electrode layer and the pixel-defining layer, and the thickness of the morphological transformation layer is not greater than the thickness of the pixel-defining layer minus the thickness of the auxiliary electrode layer.

In another embodiment, ferromagnetic particles are doped into the material for manufacturing the morphological transformation layer before the morphological transformation layer was formed on the auxiliary electrode layer. The ferromagnetic particles are iron, nickel and so on. Another substrate that will receive the morphological transformation layer as removed is called a receptor substrate. The receptor substrate has an electromagnet. When the electromagnet is energized, the ferromagnetic particles in the morphological transformation layer are subjected to the magnetic attraction, which facilitates the liquid morphological transformation layer to be removed from the auxiliary electrode layer. In addition, when a side of the substrate on which the organic functional layer is formed faces down, the morphological transformation layer is subjected to both the magnetic attraction and gravity, and under the irradiation with ultraviolet light, the morphological transformation layer transformed into the liquid state, and the corresponding part of organic functional layer can be removed from the auxiliary electrode layer more completely, e.g., transferred onto the receptor substrate.

In this embodiment, the material of the morphological transformation layer is, for example, an azobenzene group material doped with ferromagnetic particles. By utilizing the characteristic that the morphological transformation layer is transformed from solid state to liquid state under the irradiation with ultraviolet light, in combination with the characteristic that the ferromagnetic particles subjected to an external magnetic attraction are apt to be removed from the auxiliary electrode layer, the morphological transformation layer and the organic functional layer can be removed from the auxiliary electrode layer completely and quickly, without residue and with a reduced time cost.

In step S11, an organic functional layer is formed, wherein the organic functional layer covers the morphological transformation layer.

Figure 2:
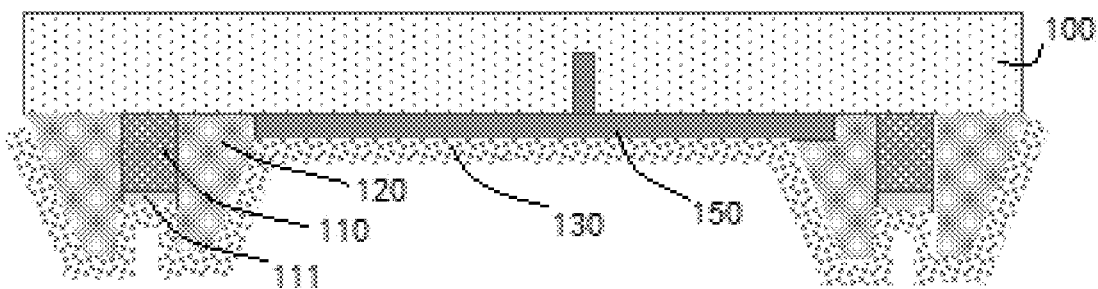
FIG. 2 is a schematic diagram showing a structure of an OLED panel after manufacturing the organic functional layer, provided by an embodiment of the present disclosure.

In an example, the organic functional layer is manufactured by evaporation or inkjet printing, such that the organic functional layer covers the morphological transformation layer. At this time, the schematic diagram of the structure of the OLED panel, as shown in FIG. 2, comprises: a substrate 100, an auxiliary electrode layer 110, a morphological transformation layer 111, a pixel-defining layer 120, an organic functional layer 130, and an anode layer 150.

In an example, the organic functional layer comprises a hole injection layer, a hole transport layer, a light-emitting layer, an electron transport layer, an electron injection layer electrically connected in this order. The hole injection layer is electrically connected with the anode layer. The electron injection layer is electrically connected with the cathode layer. The hole injection layer may be made of a material that facilitates the control of the hole injection speed. The hole transport layer may be made of a material that has a high thermal stability and facilitates hole transport. The light-emitting layer can be made of a material with high luminous efficiency. The electronic transport layer may be made of a material that has a high thermal stability and facilitates electron transport. The electron injection layer may be made of a material that facilitates the control of the hole injection speed.

Driven by a driving voltage, electrons pass from the cathode layer through the electron injection layer and the electron transport layer to the light-emitting layer, the holes pass from the anode layer through the hole injection layer and the hole transport layer to the light-emitting layer, and the electrons and the holes interact with each other in the light-emitting layer to emit light. The light passes through the electron transport layer and the electron injection layer, is incident to the cathode layer, and is emitted out of the light-emitting region of the cathode layer. As the auxiliary electrode layer lies only in the non-light-emitting region of the cathode layer, it will not block the light passing through the light-emitting region of the cathode layer.

In step S12, the morphological transformation layer and a part of the organic functional layer corresponding to the morphological transformation layer are removed from the auxiliary electrode layer. As the morphological transformation layer has the characteristic of transformation from a solid state to a liquid state, when the organic functional layer surface on the upper layer of the morphological transformation layer is directly irradiated with ultraviolet light, a transformation in state will not occur in the organic functional layer, but the morphological transformation layer is transformed from solid state to liquid state. In addition, it is also possible to irradiate the part of the organic functional layer corresponding to the morphological transformation layer with ultraviolet light.

Figure 3:
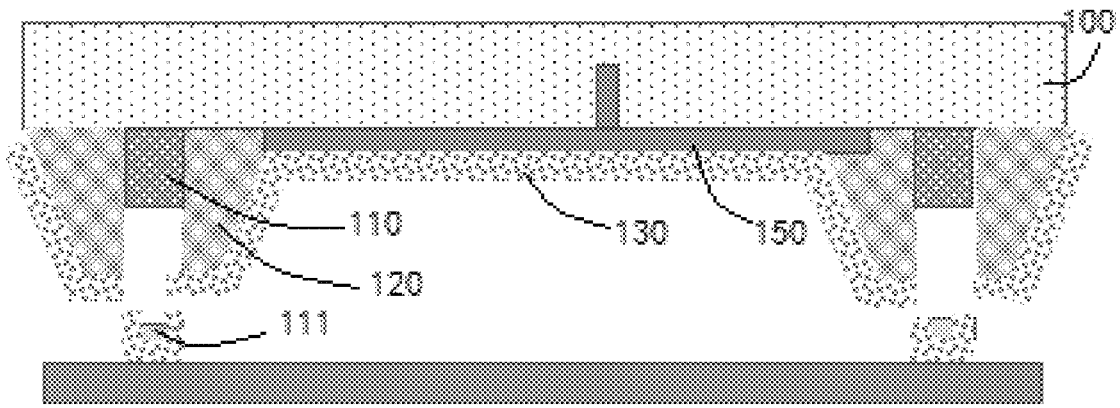
FIG. 3 is a schematic diagram showing a process in which the morphological transformation layer is removed from the auxiliary electrode layer, provided by an embodiment of the present disclosure.

Under the action of an external force, the liquid morphological transformation layer drags the corresponding part of the organic functional layer to be removed from the auxiliary electrode layer. FIG. 3 is a schematic diagram showing that the morphological transformation layer is removed from the auxiliary electrode layer under the irradiation with ultraviolet light.

The external force for example can include gravity, magnetic attraction and other forces that enable the liquid morphological transformation layer to be removed smoothly from the auxiliary electrode layer. The present disclosure provides the following several embodiments to enable the morphological transformation layer to be removed from the auxiliary electrode layer.

In at least one embodiment, the material for manufacturing the morphological transformation layer comprises a material having an azobenzene group, and removing the morphological transformation layer and a part of the organic functional layer corresponding to the morphological transformation layer from the auxiliary electrode layer comprises: making a side of the substrate on which the organic functional layer is formed face down and irradiating the organic functional layer with ultraviolet light.

In this embodiment, by making a side of the substrate on which the organic functional layer is formed face down, and irradiating the organic functional layer or the part of the organic functional layer corresponding to the morphological transformation layer with ultraviolet light, the morphological transformation layer is transformed from solid state to liquid state, so that under the action of gravity, the liquid morphological transformation layer and the corresponding part of the organic functional layer are removed from the auxiliary electrode layer. This embodiment utilizes gravity.

In an example, the material for manufacturing the morphological transformation layer further comprises ferromagnetic particles, and removing the morphological transformation layer and a part of the organic functional layer corresponding to the morphological transformation layer from the auxiliary electrode layer further comprises: attracting the ferromagnetic particles in the morphological transformation layer with a magnetic attraction force.

The corresponding step comprises: doping ferromagnetic particles into the morphological transformation layer, making a side of the substrate on which the organic functional layer is formed face down, and providing a receptor substrate at a side of the substrate opposite to the side where the morphological transformation layer is located. When the receptor substrate is energized, the ferromagnetic particles are subjected to the magnetic gravity and gravity, and the morphological transformation layer along with the organic functional layer are removed from the auxiliary electrode layer under the action of the gravity and magnetic attraction. In this example, gravity and magnetic attraction are utilized. This example enables the morphological transformation layer transformed into the liquid state to be more quickly and thoroughly removed from the auxiliary electrode layer.

Those skilled in the art would appreciate that when making the organic functional layer, if a side of the organic functional layer away from the morphological transformation layer faces up, then the substrate on which the morphological transformation layer and the organic functional layer have already been formed is overturned, such that the side of the substrate on which the organic functional layer is formed faces down. However, the side of the substrate on which the organic functional layer is formed faces down when making the organic functional layer, then it is not needed to turn over the substrate. For the side of the substrate on which the organic functional layer is formed facing down, "face down" here is not limited to that the organic functional layer is parallel to the ground or forms a specific angle with respect to the horizontal plane, as long as the morphological transformation layer after being transformed from solid state to liquid state, can be removed from the auxiliary electrode layer under the action of gravity.

In the embodiments described above, first of all, a side of the organic functional layer away from the morphological transformation layer faces down, and then the morphological transformation layer is irradiated with ultraviolet light.

The present disclosure also provides at least another embodiment, wherein the material for manufacturing the morphological transformation layer comprises a material having an azobenzene group, and wherein removing the morphological transformation layer and a part of the organic functional layer corresponding to the morphological transformation layer from the auxiliary electrode layer comprises: irradiating the organic functional layer with ultraviolet light, and making a side of the substrate on which the organic functional layer is formed face down.

The corresponding manufacturing step comprises: irradiating the organic functional layer for example with a ultraviolet lamp, and then making a side of the organic functional layer away from the morphological transformation layer face down, such that the morphological transformation layer and the corresponding part of the organic functional layer can be removed from the auxiliary electrode layer.

In the embodiment, after the morphological transformation layer is irradiated with ultraviolet light and it is transformed from solid state to liquid state, an external force is applied, so that the morphological transformation layer is removed from the auxiliary electrode layer under the action of the external force. The external force here still includes at least gravity, magnetic attraction, etc.

In an example, the material for manufacturing the morphological transformation layer further comprises ferromagnetic particles, and removing the morphological transformation layer and a part of the organic functional layer corresponding to the morphological transformation layer from the auxiliary electrode layer further comprises: attracting the ferromagnetic particles in the morphological transformation layer with a magnetic attraction force.

The corresponding manufacturing step may comprise: doping ferromagnetic particles into the morphological transformation layer, irradiating the organic functional layer with ultraviolet light, making a side of the substrate on which the organic functional layer is formed face down, and providing a receptor substrate at a side of the substrate opposite to the side where the morphological transformation layer is located. After the receptor substrate is energized, the ferromagnetic particles are subjected to the magnetic attraction and gravity, and the morphological transformation layer along with the organic functional layer are removed from the auxiliary electrode layer. This example enables the morphological transformation layer transformed into the liquid state to be more quickly and thoroughly removed from the auxiliary electrode layer.

This disclosure provides at least a further embodiment, wherein the material for manufacturing the morphological transformation layer comprises ferromagnetic particles, and removing the morphological transformation layer and a part of the organic functional layer corresponding to the morphological transformation layer from the auxiliary electrode layer comprises: irradiating the organic functional layer with ultraviolet light, and attracting the ferromagnetic particles in the morphological transformation layer with a magnetic attraction force.

The corresponding manufacturing step comprises: manufacturing an auxiliary electrode layer, doping ferromagnetic particles into the material for manufacturing the morphological transformation layer, forming a morphological transformation layer on the auxiliary electrode layer; manufacturing an organic functional layer such that the organic functional layer covers the morphological transformation layer; and irradiating the organic functional layer with for example an ultraviolet lamp. Unlike the preceding embodiments, this embodiment does not require that a side of the organic functional layer away from the morphological transformation layer faces down, but the magnetic attraction received by the ferromagnetic particles enables the morphological transformation layer and the corresponding part of the organic functional layer to be removed from the auxiliary electrode layer. This embodiment can enable the morphological transformation layer and the corresponding part of the organic functional layer to be removed from the auxiliary electrode layer without the use of gravity.

The embodiments described above can enable the morphological transformation layer and the organic functional layer to be removed from the auxiliary electrode layer. The first two embodiments differ from each other in the order of the following two steps: irradiating with ultraviolet light and making a side of the organic functional layer away from the morphological transformation layer face down. The third embodiment does not utilize gravity, but only utilizes the magnetic attraction for enabling the morphological transformation layer and the corresponding part of the organic function layer to be removed from the auxiliary electrode layer.

In step S13, a cathode layer is formed on the organic functional layer and the auxiliary electrode layer.

In an example, the cathode layer is manufactured by evaporation or sputtering etc., so that the cathode layer is stacked over the organic functional layer and the auxiliary electrode layer.

Since the morphological transformation layer and the corresponding part of the organic functional layer are removed from the auxiliary electrode layer in the step S12, the cathode layer is in direct contact with the auxiliary electrode layer at corresponding positions of the auxiliary electrode layer.

In an example, a material for manufacturing the cathode layer is a transparent material, e.g., a tin doped indium oxide (ITO for short), which is a compound containing indium, tin and oxygen, and a compound including indium, zinc and oxygen (IZO for short), which has advantages of high light transmittance and low resistivity, and can reduce the loss of light after passing through the cathode layer.

The method further comprises: forming an anode layer on the substrate before forming the morphological transformation layer on the auxiliary electrode layer.

The substrate is a flat layer of a thin film transistor substrate.

The anode layer is formed on the substrate by evaporation, sputtering and etc. When a voltage is applied between the anode and the cathode, the anode and the cathode cooperate with each other, such that the light emitting layer is excited to emit light. The light as emitted passes through the transparent cathode to achieve top emission.

In an example, the anode layer is reflective. As the anode is reflective, the ratio of light emitted from the cathode is increased and the loss of light is reduced.

A material for manufacturing the anode layer comprises a Al/ITO. Since the metal material Al has an extremely high reflectivity, it can weaken the absorption of light by the anode, reduce the rate of loss of light, and can make the light emitted from the light-emitting layer emitted from the cathode side as far as possible. Tin doped indium oxide (ITO for short), which is a compound containing indium, tin and oxygen, is a representative of the transparent conductive oxide film, has advantages of high light transmittance and low resistivity, and can reduce the loss of light after passing through this layer.

In an embodiment of this disclosure, for example, the light emitted from the organic layer is white light.

As compared to red light, green light and blue light emitted from the organic layer, the white light has a high resolution and a wide color level, and the white light-emitting device has a wider color spectrum. By forming a plurality of organic light-emitting materials emitting red, green and blue light in the light-emitting layer respectively, or by forming a pair of two organic light-emitting materials with a complementary color relationship, when using the white light display panel, color filters can be employed to obtain colors. In this case, the structure of all secondary pixel organic light-emitting layer can be similarly formed, therefore, it is easier to manufacture a display device with a large area and high resolution.

The anode layer adopts a reflective material, and the cathode layer adopts a transparent material, which can reduce the loss of light and increase the ratio of light emitted from the cathode.

Figure 4:
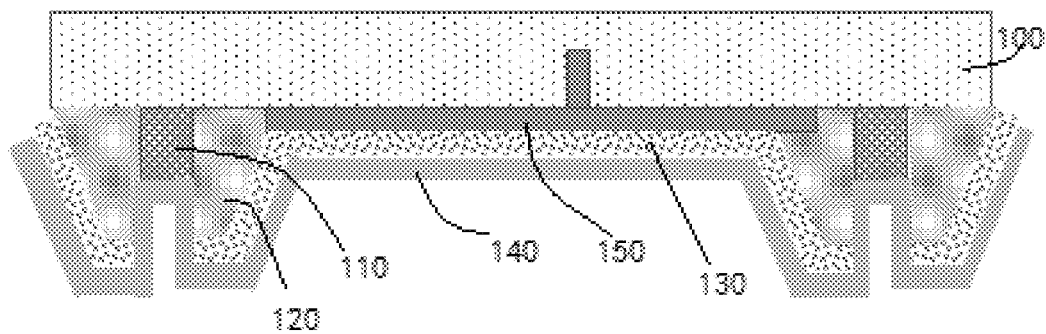
FIG. 4 is a schematic diagram showing a structure of an OLED panel provided by an embodiment of the present disclosure.

Correspondingly, the present disclosure further provides an OLED panel, and a schematic diagram for the structure of the OLED panel is shown in FIG. 4. The OLED panel comprises: a substrate 100, an auxiliary electrode layer 110, an organic functional layer 130, a cathode layer 140, an anode layer 150. The OLED panel can be manufactured by the manufacturing method of the OLED panel according to any of the above technical solutions.

Further, the OLED panel further comprises: a pixel-defining layer 120 for separating the auxiliary electrode layer 110 from the anode layer 150.

The OLED panel comprises an array of a plurality of pixels, wherein the anodes of the various pixels are separated from each other by the pixel-defining layer 120 to realize mutual electrical insulation, and the anode of each pixel obtains an electrical signal through a thin film transistor connected therewith. The light-emitting layer and the cathode layer cover the entire pixel array, and the power supply located on a side of the pixel array supplies power for the cathode layer.

A material for manufacturing the pixel-defining layer may include materials with a very low light transmittance such as resin, polyimide or silica, or may adopt completely opaque materials.

In embodiments of the present disclosure, the distribution of the auxiliary electrodes can be designed according to a magnitude of the surface resistance of the cathode layer. For example, when the surface resistance is larger, one auxiliary electrode is provided for each pixel-defining layer, and when the surface resistance is smaller, one auxiliary electrode is provided for a plurality of pixel-defining layers (e.g., for every 2 or 3 pixel-defining layers). The pixel-defining layer surrounds the auxiliary electrode.

The present disclosure further provides a display device comprising the OLED panel according to any of the preceding technical solutions.

The display device can be an electronic paper, a display panel, a mobile phone, a tablet computer, a television set, a monitor, a notebook computer, a digital photo frame, a navigator, and any product or component with a display function.

As the display device is based on the OLED panel, the display device naturally inherits all advantages of the OLED panel.

To sum up, the OLED panel and manufacturing method thereof provided by an embodiment of the present disclosure irradiate the morphological transformation layer with ultraviolet light, so that the morphological transformation layer and the corresponding part of the organic functional layer are removed from the auxiliary electrode layer, thereby exposing the auxiliary electrode, and then a cathode layer is formed to realize an effective contact between the auxiliary electrode layer and the cathode layer, thereby reducing the voltage drop of the cathode layer, and increasing the uniformity of display brightness of the display device. The present discloses utilizes the characteristic that the morphological transformation layer can be transformed from a solid state to a liquid state under the irradiation with for example an ultraviolet lamp, without the need of manufacturing the organic functional layer in a segmental manner, which simplifies the manufacturing process.

Although some illustrative embodiments of the present disclosure have already been illustrated above, those skilled in the art could appreciate that, variations may be made to the illustrative embodiments without departing from the principle or spirit of the present disclosure, and the scope of patent protection of the present disclosure is determined by the claims and their equivalents.

What is claimed is:

1. A method for manufacturing an Organic Light-Emitting Diode (OLED) panel, comprising:
    forming an auxiliary electrode layer on a substrate, and forming a morphological transformation layer on the auxiliary electrode layer;
    forming an organic functional layer, wherein the organic functional layer covers the morphological transformation layer;
    removing the morphological transformation layer transformed from a solid state to liquid state and a part of the organic functional layer corresponding to the morphological transformation layer from the auxiliary electrode layer; and
    forming a cathode layer on the organic functional layer and the auxiliary electrode layer;
    wherein a material for manufacturing the morphological transformation layer comprises a material having an azobenzene group, and
    wherein removing the morphological transformation layer and a part of the organic functional layer corresponding to the morphological transformation layer from the auxiliary electrode layer comprises:
    making a side of the substrate on which the organic functional layer is formed face down, and irradiating the organic functional layer with ultraviolet light, or
    irradiating the organic functional layer with ultraviolet light and making a side of the substrate on which the organic functional layer is formed face down.

2. The method according to claim 1, wherein the material for manufacturing the morphological transformation layer further comprises ferromagnetic particles, and
    wherein removing the morphological transformation layer and a part of the organic functional layer corresponding to the morphological transformation layer from the auxiliary electrode layer further comprises: attracting the ferromagnetic particles in the morphological transformation layer with a magnetic attraction force.

3. The method according to claim 1, wherein irradiating the organic functional layer with ultraviolet light comprises: irradiating the part of the organic functional layer corresponding to the morphological transformation layer with ultraviolet light.

4. The method according to claim 1, wherein the auxiliary electrode layer is located in a non-pixel light-emitting region of the cathode layer.

5. The method according to claim 4, wherein a material for manufacturing the auxiliary electrode layer comprises: silver, magnesium, aluminum or alloy metal.

6. The method according to claim 4, wherein the auxiliary electrode layer has a thickness in a range of about 200 nm-2000 nm.

7. The method according to claim 4, wherein the auxiliary electrode layer has a resistivity less than $5*10^{-8}$ $\Omega \cdot m$.

8. The method according to claim 1, further comprising: forming an anode layer on the substrate before forming the morphological transformation layer on the auxiliary electrode layer.

9. The method according to claim 8, wherein the anode layer is reflective.

10. An OLED panel manufactured by the method of manufacturing the OLED panel according to claim 1.

11. The OLED panel according to claim 10, further comprising: a pixel-defining layer for separating the auxiliary electrode layer from the anode layer.

12. The OLED panel according to claim 11, wherein a thickness of the auxiliary electrode layer is less than a thickness of the pixel-defining layer.

13. The OLED panel according to claim 11, wherein an auxiliary electrode is provided for each pixel-defining layer, or an auxiliary electrode is provided for a plurality of pixel-defining layers.

14. A display device comprising the OLED panel according to claim 10.

15. A method for manufacturing an Organic Light-Emitting Diode (OLED) panel, comprising:
    forming an auxiliary electrode layer on a substrate, and forming a morphological transformation layer on the auxiliary electrode layer;
    forming an organic functional layer, wherein the organic functional layer covers the morphological transformation layer;
    removing the morphological transformation layer transformed from a solid state to liquid state and a part of the organic functional layer corresponding to the morphological transformation layer from the auxiliary electrode layer; and
    forming a cathode layer on the organic functional layer and the auxiliary electrode layer;
    wherein a material for manufacturing the morphological transformation layer comprises ferromagnetic particles, and
    wherein removing the morphological transformation layer and a part of the organic functional layer corresponding to the morphological transformation layer from the auxiliary electrode layer comprises: irradiating the organic functional layer with ultraviolet light and attracting the ferromagnetic particles in the morphological transformation layer with a magnetic attraction force.

16. The method according to claim 15, wherein irradiating the organic functional layer with ultraviolet light comprises: irradiating the part of the organic functional layer corresponding to the morphological transformation layer with ultraviolet light.

17. An OLED panel manufactured by the method of manufacturing the OLED panel according to claim 15.

18. The OLED panel according to claim 17, further comprising: a pixel-defining layer for separating the auxiliary electrode layer from the anode layer.

19. The OLED panel according to claim 18, wherein a thickness of the auxiliary electrode layer is less than a thickness of the pixel-defining layer.

20. The OLED panel according to claim 18, wherein an auxiliary electrode is provided for each pixel-defining layer, or an auxiliary electrode is provided for a plurality of pixel-defining layers.

* * * * *